United States Patent [19]

Herndon et al.

[11] Patent Number: 4,937,511
[45] Date of Patent: Jun. 26, 1990

[54] ROBOTIC SURFACE MOUNT ASSEMBLY SYSTEM

[75] Inventors: Donnie H. Herndon; Robert D. Peck, both of Palm Bay, Fla.

[73] Assignee: Western Technologies Automation, Inc., Palm Bay, Fla.

[21] Appl. No.: 315,937

[22] Filed: Feb. 27, 1989

Related U.S. Application Data

[63] Continuation of Ser. No. 75,988, Jul. 21, 1987, abandoned.

[51] Int. Cl.⁵ .................. H01L 21/58; B25J 11/00
[52] U.S. Cl. ........................... 318/568.21; 318/568.11; 901/6; 901/38
[58] Field of Search .............. 318/567, 568.11, 568.21; 901/6, 7, 8, 30, 36, 38

[56] References Cited

U.S. PATENT DOCUMENTS

| | | | |
|---|---|---|---|
| 3,958,740 | 5/1976 | Dixon | 901/6 X |
| 4,538,956 | 9/1985 | Kalkbrenner et al. | 901/6 X |
| 4,587,703 | 5/1986 | Azizi et al. | 901/7 X |
| 4,674,181 | 6/1987 | Hamada et al. | 901/7 X |
| 4,677,808 | 7/1987 | Chenevard | 901/7 X |
| 4,789,292 | 12/1988 | Holcomb | 901/6 X |

Primary Examiner—Bentsu Ro
Attorney, Agent, or Firm—Evenson, Wands, Edwards, Lenahan & McKeown

[57] ABSTRACT

A robotic transport and assembly system includes a worktable upon which are supported a printed circuit board conveyor, a controllably displaceable circuit component feed mechanism and a robotic manipulator, mounted on the worktable and having a multi(four)-axis end effector, for controllably seizing an electronic circuit component from the component feed mechanism and placing the seized component on the printed circuit board for surface mounted attachment. The controllably displaceable circuit component feed mechanism, which includes a component feed device and an associated feeder device positioning table, is mounted on the worktable at a position adjacent to the position whereat a printed circuit board is supported for the pick and placement operation of the robotic manipulator. The component feed device controllably supplies a plurality of the components to be seized by the end effector and placed on said workpiece by the robotic manipulator. A control processor is coupled with the robotic manipulator and the transport mechanisms for controlling their operation such that, during a pick and placement cycle, the component feed device locates the next component to be captured by the robotic manipulator at pickup point which is centrally located within the work envelope of the robotic manipulator. In other words, control of the component feed device positioning mechanism is dependent upon the next transport action of the robotic manipulator, so as to effectively minimize component capture and surface mount cycle time.

33 Claims, 3 Drawing Sheets

ROBOTIC SURFACE MOUNT ASSEMBLY SYSTEM

The present application is a continuation of application Ser. No. 075,988, filed July 21, 1987 now abandoned, entitled "Robotic Surface Mount Assembly System", by Donnie H. Herndon and Robert D. Peck, and assigned to the assignee of the present application.

FIELD OF THE INVENTION

The present invention relates in general to conveying, handling and assembly systems and is particularly directed to a programmable electronic circuit component assembly system which employs processor-controlled dual motion component feed and robotic manipulator mechanisms for transporting, placing and assembling surface mounted electronic components on a printed circuit board.

BACKGROUND OF THE INVENTION

As improvements in integrated circuit processing methodologies continue to reduce the physical size of electronic circuit components, the assembly (mounting and interconnection) of such components on a support-/interconnect structure (e.g. printed circuit board) mandates the use of high precision handling and placement mechanisms. In order to attain industrially practical production requirements such systems are usually custom designed for a particular type or class of components, and incorporate placement mechanisms the movement capability of which is constrained (so as to achieve high speed transport in a given direction). As a consequence, such systems have only limited application, thereby necessitating the use of a plurality of specifically dedicated systems for assembly of different types and sizes of components which increases manufacturing complexity and cost.

SUMMARY OF THE INVENTION

In accordance with the present invention the limited performance capabilities of conventional, custom designed circuit component assembly systems are obviated by a new and improved robotic transport and assembly system which provides flexibility not heretofore achievable with non robotic systems, yet is capable of reduced cycle time performance previously enjoyed by only dedicated motion units, thereby making it industrially practical for meeting the needs of a variety of placement and assembly applications.

For this purpose the system includes a worktable upon which are supported a workpiece (printed circuit board) conveyor, a controllably displaceable (circuit) component feed mechanism and a robotic manipulator, mounted on the worktable and having a multi(four)-axis end effector, for controllably seizing an electronic circuit component from the component feed mechanism and placing the seized component on the printed circuit board for surface mounted attachment. The controllably displaceable circuit component feed mechanism, which includes a component feed device and an associated device positioning mechanism, is mounted on the worktable at a location adjacent to an assembly station whereat a printed circuit board is supported for the pick and placement operation of the robotic manipulator. The component feed device controllably supplies a plurality of electronic circuit components to be seized by the end effector and placed on the printed circuit board by the robotic manipulator. A control processor is coupled with the robotic manipulator and the component feed mechanism for controlling their operation such that, during a pick and placement cycle, the component feed mechanism locates the next component to be captured by the robotic manipulator at pickup point which is centrally located within the work envelope of the robotic manipulator. In other words, control of the component feed device positioning mechanism is dependent upon the next transport action of the robotic manipulator, so as to reduce travel time of the robot arm and thereby effectively minimize component capture and surface mount cycle time.

DETAILED DESCRIPTION

Figure 1:
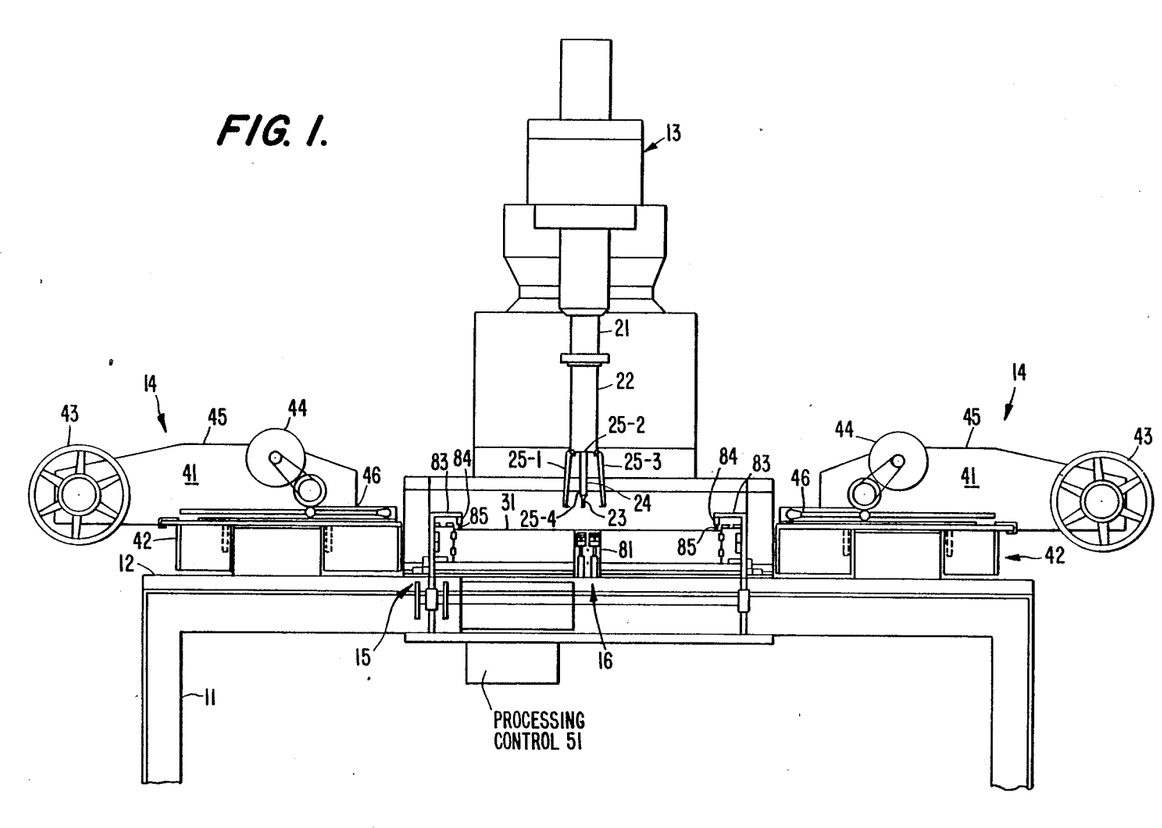
FIGS. 1 and 2 are respective front and plan diagrammatic views of a robotic surface mount assembly system in accordance with the present invention.
Figure 2:
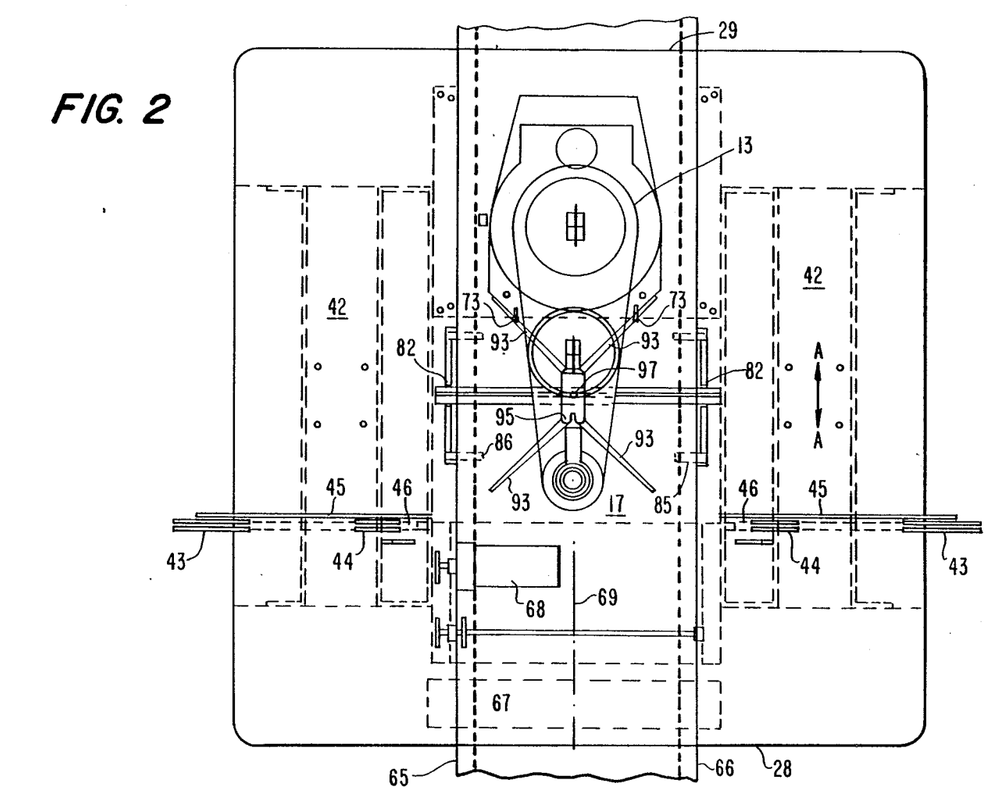

Referring now to FIGS. 1 and 2, there are illustrated respective front and plan diagrammatic views of a robotic surface mount assembly system in accordance with the present invention. As shown therein the system is comprised of a worktable 11, preferably formed of welded steel channel, having a substantially planar steel top plate 12 to which all of the physical manipulation units of the system are integrally mounted. These units include a robotic manipulator 13, a controllably positionable circuit component feed unit 14, a workpiece (circuit board) conveyor 15 and an elevator/latch unit 16. Control/drive mechanisms for these respective manipulation units are mounted beneath top plate 12, so as to facilitate alignment and minimizes spacing among the topside-mounted units of the system. In addition, electrical and pneumatic control drive mechanism (not shown) are preferably mounted at one end of the worktable, so as to be easily accessible at one location for maintenance.

Robotic manipulator 13 is preferably comprised of four-axis SCARA manipulator employing digital signal direct-drive, such as an AdeptTwo robotic manipulator manufacture by Adept Technology, which is capable of performing a pick and place transport cycle of one inch up, twelve inches over, one inch down and back in less than one second with a one pound load, and can accurately increment distances on the order of one-quarter mil at the end of a robot arm 21. Robot arm 21 includes an end effector 22, which preferably includes a quick-change vacuum tip 23 for handling the circuit components to be surface-mounted to a printed circuit board. Built into the vacuum tip 23 of end effector 22 is an optical sensor 24 which verifies part presence during handling operations. For precision location of a vacuum-captured part, end effector 22 also contains a set of four orthogonally distributed centering arms 25-1 . . . 25-4 for alignment of the parts (by 'squaring-up' their side edges) during capture.

The electronic circuit components to be surface mounted on a printed circuit board are delivered to a controllably adjustable pickup point for capture by the robotic manipulator by way of one or more (a pair being shown in FIG. 1) controllably positionable component feed units 14 mounted on the worktable at positions adjacent to an assembly station 17 whereat a printed circuit board 31 is supported by elevator/latch unit 16 for the pick and placement operation of robotic manipulator 13. The component feed unit includes one or more feed device 41, through which the electronic circuit components are fed, one at a time, from a storage medium, and a transport table 42, on which the feed device is mounted, for enabling the feed device to be controllably translated along the surface of the worktable adjacent to the assembly station 17. Feed device 41 may take a variety of forms, such as a tape feeder, tray feeder, vibratory tube feeder and gravity feeder. In accordance with a preferred embodiment of the invention, feed device 41 preferably includes a tape feed device having a set of reels 43 and 44 which are controllably stepped to advance circuit components carried by tape 45 to a pickup point 46 whereat the components are to be seized by end effector 22 of robotic manipulator 13. Such a tape feed device may comprise a Taped Component Feeder manufactured by Goleman Engineering. In the plan view of FIG. 2, only one feed device 41 is shown on each side of the work station. It should be observed, however, that a plurality of such devices may be arranged in side-by-side parallel relationship, for handling a number of component feed tapes. Indexing of a respective feed device is carried out under processor control.

In operation, the tape 45 is routed via reels 43 and 44 through an indexing mechanism (comprised of a mechanical indexing element activated by a pneumatic cylinder, not shown) to pickup point 46. As each circuit component carried by tape 45 is indexed into position, a cover tape used to retain the component on the tape is stripped, exposing the component to be seized by the end effector 22. After a component has been captured by the robotic manipulator, the empty tape is curved downwardly, beyond the component pickup point and reenters the indexing mechanism near the base of the feeder. The indexing mechanism feeds the empty tape out the rear of the feed device so that it may be severed and discarded.

As pointed out above and as will be described in detail below, a control processor, shown at 51, is coupled to the respective units of the system for controlling their operation such that, during a pick and placement cycle, controllably positionable component feed unit 14 locates the next component to be captured by the robotic manipulator 13 at pickup point which is centrally located within the work envelope of the robotic manipulator 13. For this purpose, control processor 51 may comprise a VAL II processor manufactured by Adept Technology. Since a description of its configuration is unnecessary for gaining an appreciation of the present invention, no detailed description of processor 51 will be presented here. Instead, the surface mount assembly control algorithm through which processor 51 supervises and controls the actions of the respective units of the system will be described below in terms of the sequence of steps that are carried out during system calibration and assembly operations. In addition, a source code program through which processor 51 controls the operation of the system is set forth below in Appendix A.

As pointed out above, component feed device 41 (here tape feeder) is mounted on a controllably translatable transport table 42, which preferably comprises a precision single-axis positioning table driven by an indexable stepping drive, such as a Computer KSX-230 DC Servo motor/index/drive unit. As will be explained below with reference to FIGS. 3-6, table 42 is controllably translated back and forth in the direction of arrows A—A (shown in FIG. 2), so as to locate each circuit component supplied by feed device 41 for seizure by end effector 22 at a pickup point 46 that is located midway of the work envelope of the robotic manipulator.

Delivery of a printed circuit board to assembly station 17, whereat robotic manipulator surface-mounts electronic circuit components that have been captured from feed device 41, is accomplished by a circuit conveyor 15 mounted on worktable 11 beneath robotic manipulator 1 and extending between opposite sides 28 and 29 of the worktable 11, so as to permit printed circuit boards to be placed on conveyor 16 at side 28 of the worktable and delivered to its opposite side 29 after completion of the surface mounting of components at assembly station 17.

Conveyor 15 preferably is comprised of a pair of spaced apart rails 65 and 66 on which are mounted a plurality of free spinning conductive rollers 67, allowing queuing and accumulation of multiple circuit boards without damage. The rollers may be driven by a conveyor drive 68, located beneath table 11. To limit movement of and facilitate accurate positioning of a circuit board 31 as it is delivered to the assembly station 17 adjacent to robotic manipulator 13, a set of adjustable stops 73 are provided, as shown. To stably position and secure a printed circuit board 31 at assembly station 17, an elevator/latch unit 16, comprising an elevator 81 and a circuit board engaging latch 82 are located at assembly station 17. Latch 82 comprises a set of inverted-L-shaped brackets 83 to the ends 84 of which are affixed tooling pins 85 that are adapted to engage a set of tooling holes 86 located along the edges of a board 31. Engagement with the tooling holes 86 by the pins 85 of the latch is effected by the action of elevator 81 raising which a set of four adjustable circuit board support arms 93, which are horizontally rotatable about pivot points 95, so as to provide an expandable support framework upon which a printed circuit board is raised into engagement with latch 82, in preparation for the surface mounting of circuit components, as will be described in detail below.

OPERATION

Operation of the transport and assembly system according to the present invention is controlled by processor 51 and includes a system setup procedure and a component-to-board surface mount assembly. The sequence of events through which processor 51 controls respective operations of the units of the system and the manner in which the units interface with one another will now be explained.

SETUP PROCEDURE

Because the printed circuit board upon which circuit components are to be mounted is not limited to a specific size, it is initially necessary to adjust the dimensional constraints of those units which will guide and position a board during the transport and assembly process. Consequently, it is necessary to adjust the width of conveyor 15 by moving one or both of side rails 65 and 66 in accordance with the width of a board, so as to provide a prescribed clearance (e.g. 1/16") between the edges of the board and the rails. Next, the elevator/latch unit 16 is positioned such that its center 97 is located on the centerline 69 of conveyor 15.

With the conveyor 15 and elevator/latch unit 16 adjusted, a sample board 31 is placed in position on rollers 67 of the conveyor and against stop pins 73. Latch mechanism 82 is engaged so that tooling pins 85 are aligned over holes 86 along the edge of the board. The support arms 93 of elevator 81 are spread apart so as to accommodate the areal dimensions of the board and elevator 81 is raised, whereby the holes 86 in the board will be engaged by tooling pins 85. Any misalignment is corrected at this time and locking bolts (not shown) for each of the adjustable fixtures (conveyor rails, elevator arms) are then secured.

With adjustments for transportation and positioning of the board having been completed, it is next necessary to calibrate the operation of the robotic manipulator 13. For this purpose, the control software of the manipulator contains a location calibration sequence through which the end effector 22 is referenced to a predetermined point on the board for all pick and place movements. Consequently, it is first necessary to define the geometrical coordinates of the reference point with respect to which the end effector is positioned. For this purpose robotic manipulator 13 is controllably moved to a position over a tooling pin 85 which has been previously aligned with a reference hole (not shown) that is to be used as the reference point for the positioning control data base within the manipulator's control software. The top of tooling pin 85 is preferably configured in the shape of a cone to accommodate a variable range of dimensions to which the accuracy of the centering arms 25 of end effector 22 ma be refined. The end effector 22 is lowered onto the cone until vacuum tip 23 contacts the cone base. The tooling pin bracket 83 is then checked for any deflection. If any bending has occurred, end effector 22 is raised until the bending stress has been relieved. With vacuum tip 23 of end effector 22 now precisely located at the reference point of tooling pin 85 in reference hole, the coordinate position of the robot arm is entered into the control processor's data base as the reference point, so that through execution of the robotic operation program (provided by the manufacturer) the manipulator will be calibrated for operation.

SYSTEM OPERATION

With the system calibrated and ready for operation, a printed circuit board 31 upon which components are to be surface-mounted is loaded on conveyor 15, so as to be delivered to assembly station 17 (whereat elevator/latch unit 16 is located). Placement of board 31 on conveyor 15 may be detected by a sensor (not shown) which signals processor 51 of the board's presence. Conveyor 15 is activated and board 31 is transported thereby to assembly station 17. When the board arrives at the assembly station it contacts stop pins 73 inhibiting further movement of the board. A detector (not shown) senses the presence of the board at the assembly station and signals processor 51 to activate elevator 81 to raise the board off the conveyor. At the same time processor 51 deactivates the conveyor.

Elevator 81 lifts the board 31 into engagement with tooling pin brackets 83, so that the tooling pins 85 engage holes 86 in the board, to accurately locate and secure the position of the board 31 at the assembly station 17. With board 31 secured, processor 51 activates feed device transport table 42, causing the feed device 41 to be transported to a pickup point 46 which is midway between the current position of end effector 22 and that location on board 31 whereat the part to seized from feed device 41 is to be surface mounted. Thereafter, successive parts supplied by feed device 41 are delivered to respective pickup points each of which is located centrally of the work envelope of end effector 22 in the course of surface mounting parts on board 31. This controlled movement of feed device 41 in conjunction with the pick and place action of end effector 22 constitutes a significant improvement of the present invention with respect to conventional assembly systems and may be best understood with reference to FIGS. 3–6, which diagrammatically illustrate the positioning of controllably positionable feed unit 41 relative to printed circuit board for successive pick and place actions of robotic manipulator 13.

Figure 3:
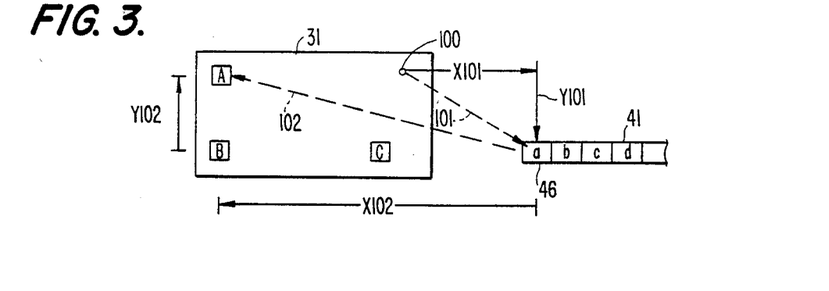
FIGS. 3–6 diagrammatically illustrate the positioning of a feed transport mechanism relative to a printed circuit board for successive pick and place actions of the system of FIGS. 1 and 2.

More particularly, FIG. 3 shows a printed circuit board 31 having a plurality (e.g. three locations for purposes of simplifying the present example) of spaced apart surface mounting locations A, B and C at which respective circuit components a, b and c supplied by feed device 41 are to be surface-mounted. Also shown in FIG. 3 is a location 100 at which end effector 22 is initially located (such as reference hole location 86R as described above in conjunction with the set-up procedure). Given the condition shown in FIG. 3, the conventional use of a robotic manipulator would involve the displacement of end effector 22 from its current location 100 along a 'seize' travel path, represented by broken lines 101, to a pick-up point 46 whereat component a is supplied by feed device 41. After seizing component a at pick-up point 46, end effector 22 would then be translated along 'placement' path 102 to location A whereat component a is to be mounted. As shown in FIG. 3, each of 'seize' path 101 and 'placement' path 102 may be represented by respective geometrically orthogonal path components X101,Y101 and X102,Y102. As will be appreciated from the description to follow, the lengths of the Y path components for each seize and placement operation of the end effector in a conventional surface mount system effectively limit its speed of assembly.

Figure 4:
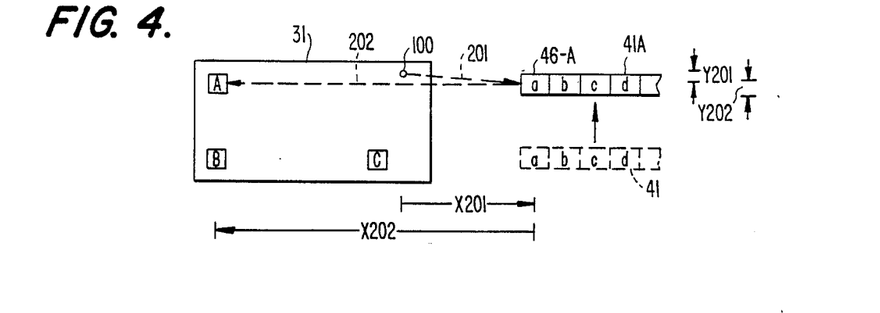

Referring now to FIG. 4, the condition illustrated in FIG. 3 is repeated, with the FIG. 3 location of feed device 41 being shown in broken lines and its translated position in accordance with the present invention being shown by solid lines. Also shown in FIG. 4 are respective 'seize' travel path 201 and 'placement' travel path 202 to be traversed by end effector 22 in the course of its movement from location 100 to new pick-up point 46-A and therefrom to surface mounting location A. In addition, the respective X and Y path components of travel paths 201 and 202 are illustrated as orthogonal path lengths 201X,201Y and 202X,202Y.

In accordance with the present invention, knowing the current location 100 of end effector 22 and its next delivery location A on board 31, during movement of robotic manipulator 13, processor 51 translates table 42 and, thereby, feed device 41 to a new pick-up point 46-A located at a coordinate position such that the respective Y components of paths 201 and 202 are the same. Namely, feeder transport table 42 is moved (simultaneously with end effector 22 of robotic manipulator 13) so that pick-up point 46-A of feeder 41 is located centrally of the travel (work) envelope of end effector 22 between its starting position (location 100 in each of FIGS. 3 and 4) and the position (A) on the workpiece (printed circuit board 31) at which it delivers a seized component. From a comparison of the lengths of the X and Y components of paths 101 and 102 with those of paths 201 and 202, it can be seen that the overall travel distance of end effector 22 is reduced for path 201-202. Consequently, the travel time of end effector is shortened, thereby increasing the system's speed of assembly.

Figure 5:
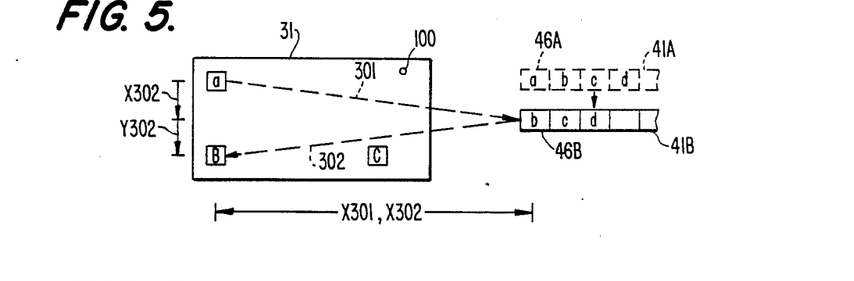
Figure 6:
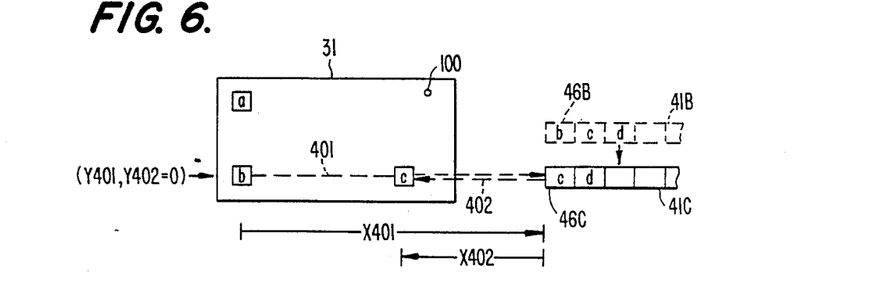

This effect of the present invention is further diagrammatically illustrated in FIGS. 5 and 6 which depict the manner in which feed device 41 is controllably translated by table 42 to continuously locate pick-up point 46 at a position midway of the travel envelope of end effector 22 for each successive pick and place operation for additional surface mounting locations, here locations B and C. In FIG. 5, with the next successive surface mounting location B being displaced in the Y direction with respect to the coordinate location of location A, feed device 41 is translated to a new position, so that component b, which is to be surface mounted at location B, will be supplied to a new pick-up point 46-B, located midway of the movement of end effector 22, over new 'seize' travel path 301 and 'placement' travel path 302. Like the translated pick-up point for the condition shown in FIG. 3, pick-up point 46-B is located such that the Y path components 301Y and 302Y of travel paths 301 and 302, respectively, are equal, thereby minimizing end effector travel time during its work cycle from the location of its immediately previous placement action (location A), pick-up point 46 (here pick-up point 46-B) and the location of its next placement (of component b at location B).

In FIG. 6, the next successive surface mounting location C is shown as being displaced in the X direction, but not in the Y direction, with respect to the coordinate location of location B. As a result, for the new position to which feed device 41 is translated, the new pick-up point 46-C, whereat component c, which is to be surface mounted at location C, is supplied by feed device 41, is colinear with locations B and C, thereby reducing the Y components of travel paths 401 and 402 to zero.

In terms of the actual mechanical operations which take place in the course of the seizure, delivery and placement steps executed on end effector 22 by robotic manipulator 13, for an exemplary condition of the printed circuit board 31 and controllably positionable feed unit 14 as illustrated in FIG. 5, once the feed device 41 is translated to its new pick-up point, e.g. pick-up point 46-B, a pneumatic cylinder (not shown) located beneath the pick-up point on the transport table 42 is activated, causing an associated transport rod (not shown) to engage a lever arm (not shown) on the feed device which positions the next component (component b) so that it can be seized by end effector 22. During movement of transport table 42 to its new position 41-B, robot arm 21 is moved toward pick-up point 46-B and the tip of the end effector is adjusted for capturing component b. Once in position at pick-up point 46-B the robot extends vacuum tip 23, so that it comes in contact with the component. The vacuum line to the tip is then activated and the component b is vacuum-seized by the tip of the end effector. Next, the vacuum tip 23 is retracted and robot arm 21 is moved along 'placement' travel path 302 to placement location B on printed circuit board 31.

As the end effector moves component b into position over placement location B, the four alignment (centering) arms 25-1 . . . 25-4 of centering are engaged to effectively 'center' the component b on the vacuum tip 23. With component b centered on the vacuum tip 23 at the placement position B, the vacuum tip is extended until the component comes in contact with the printed circuit board, at which time the vacuum is terminated, thereby leaving component b at surface-mount location B.

Robot arm 21 then begins a new cycle travelling along 'seize' path 401 toward pick-up point 46-C, as feeder transport mechanism is translated to position 41-C, shown in FIG. 6. At the same time, the feed device 41 indexes the feeder tape to present the next component c to the pick-up position 46-C. A cutting mechanism (not shown) beneath the feeder transport table 42 severs excess tape as it wraps around the transport table 42, causing severed tape segments to fall into a collection receptacle (not shown) beneath the worktable.

During the above sequence of operations, whenever a particular feeder has finished delivery of all components of a specified size, feed unit 14 indexes feed device 41 to the next largest-sized component. This cycling of parts and feed devices continues until the printed circuit is fully populated. The elevator 81 is then activated, lowering the completed board 31 to conveyor 15, which is engaged to transport the board to exit the worktable.

As will be appreciated from the foregoing description, the robotic transport and assembly apparatus in accordance with the present invention offers high throughput and versatility in the handling and assembly of electronic circuit boards. By employing a robotic manipulator and associated adjustable transport units, the system is adaptable to components and mounting surface of varying shapes and sizes, and thereby offers a considerable savings in cost when compared to customized, limited application systems. In addition, by employing a component feed mechanism that is controllably positionable, the pick and place travel time of the robotic manipulator is reduced, enabling the system to provide an assembly performance normally achievable by limited motion (non-robotic) systems.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A system for transporting and assembling a plurality of components with respect to a workpiece comprising:

a worktable upon which said workpiece is supported;
   a robotic manipulator, coupled with said worktable and having an end effector, for controllably seizing a component from a component feed mechanism and placing said seized component on said workpiece;
   said component feed mechanism being coupled with said worktable, containing a plurality of component feed devices arranged adjacent to one another, each feed device storing and feeding a plurality of components, and including transport means, arranged to be coupled with each of said adjacent component feed devices, for causing a component in any of said plurality of component feed devices to be transported to a position to be seized by said end effector, so as to be placed on said workpiece by said robotic manipulator; and control means, coupled with said robotic manipulator and said component feed mechanism, for controlling the operation of said robotic manipulator and said component feed mechanism such that, during travel of said robotic manipulator and said transport means to a position whereat a component is seized by said robotic manipulator for placement on a component mounting position on said workpiece, there is simultaneous translational movement of said end effector and said transport means.

2. A system according to claim 1, wherein said component feed devices are arranged in side-by-side parallel relationship.

3. A system according to claim 2, wherein said transport means includes means for causing a component in any of said plurality of component feed devices to be transported to a position to be seized by said end effector for placement on said workpiece by said robotic manipulator, such that said side-by-side, parallel relationship of said component feed devices is maintained during transport.

4. A system according to claim 1, further including workpiece conveyor means, coupled with said worktable, for controllably conveying said workpiece with respect to a location on said worktable whereat said robotic manipulator places components that have been seized from said component feed mechanism.

5. A system according to claim 4, wherein said worktable is sized to accommodate differently sized workpieces.

6. A system according to claim 1, further including a camera device, optically coupled with said workpiece, for enabling visually inspection of the component placement operation carried out by said end effector.

7. A system for transporting and assembling a plurality of components with respect to a workpiece comprising:
a worktable upon which said workpiece is supported;
a robotic manipulator, coupled with said worktable and having an end effector, for controllably seizing a component from a component feed mechanism and placing said seized component on said workpiece;
said component feed mechanism being supported on said worktable adjacent to the location where said workpiece is supported, containing a plurality of component feed devices arranged adjacent to one another, each feed device storing and feeding a plurality of components, and including transport means, coupled with each of said adjacent component feed devices, for transporting each of said plurality of component feed devices, so that a component stored and fed by one of said component feed devices and to be seized by said end effector is delivered to a pick-up position from which said component may be seized and placed on said workpiece by said robotic manipulator; and
control means, coupled with said robotic manipulator and said component feed mechanism, for controlling the operation of said robotic manipulator and said component feed mechanism such that, during travel of said robotic manipulator and said transport means to a position whereat a component is seized by said robotic manipulator for placement on a component mounting position on said workpiece, there is simultaneous translational movement of said end effector and said transport means, thereby shortening the travel time of said end effector and increasing the system's speed of assembly.

8. A system according to claim 7, wherein said pick-up position is located at a prescribed location in the work envelope of said robotic manipulator.

9. A system according to claim 7, wherein said component feed devices are arranged in side-by-side parallel relationship.

10. A system according to claim 7, further including workpiece conveyor means, coupled with said worktable, for controllably conveying said workpiece with respect to a location on said worktable whereat said robotic manipulator places components that have been seized from said component feed mechanism.

11. A system according to claim 10, wherein said worktable is sized to accommodate differently sized workpieces.

12. A system according to claim 7, further including a camera device, optically coupled with said workpiece, for enabling visually inspection of the component placement operation carried out by said end effector.

13. A system for transporting and assembling a plurality of components with respect to a workpiece comprising:
a worktable upon which said workpiece is supported;
a robotic manipulator, coupled with said worktable and having an end effector, for controllably seizing a component from a component feed mechanism and placing said seized component on said workpiece;
said component feed mechanism being coupled with said worktable and being displaceable with respect to the location of said workpiece, and controllably supplying a plurality of said components to be seized by said end effector and placed on said workpiece by said robotic manipulator, said component feed mechanism including a plurality of component feed transport devices, each component feeder transport device supplying a plurality of components for placement by said robotic manipulator on said workpiece and being positioned adjacent to that location on said worktable whereat said workpiece is supported; and
control means, coupled with said robotic manipulator and said component feed mechanism, for controlling the operation of said robotic manipulator and said component feed mechanism such that, for each cycle of travel to seize a component and place a seized component on said workpiece by said robotic manipulator said component feed mechanism is positioned at a location which shortens travel time of said end effector and including means for controlling the operation of said robotic manipulator and said component feed mechanism such that there is simultaneous translational movement of said end effector and said component feed mechanism to a location whereat a component supplied by said feed mechanism for placement on said workpiece is seized by said end effector and transported thereby to be placed on a prescribed component mounting location on said workpiece.

14. A system according to claim 13, wherein said worktable is sized to accommodate differently sized workpieces.

15. A system according to claim 13, wherein said component feed mechanism comprises means for storing a plurality of said components and controllably feeding individual ones of said plurality of components to a position to be seized by said end effector and placed thereby on said workpiece.

16. A system according to claim 15, wherein said component feed mechanism further includes transport means, coupled with said worktable and said storing and controllably feeding means, for controllably transporting said storing and controllably feeding means over the surface of said worktable.

17. A system according to claim 13, further including workpiece conveyor means, coupled with said worktable, for controllably conveying said workpiece with respect to a location on said worktable whereat said robotic manipulator places components that have been seized from said component feed mechanism.

18. A system according to claim 13, further including a camera device, optically coupled with said workpiece, for enabling visual inspection of the component placement operation carried out by said end effector.

19. A system according to claim 18, wherein said worktable is configured to accommodate differently sized workpieces.

20. A system for transporting and assembling a plurality of components with respect to a workpiece comprising:
   a worktable upon which said workpiece is supported;
   a robotic manipulator, coupled with said worktable and having an end effector, for controllably seizing a component from a component feed mechanism and placing said seized component on said workpiece;
   said component feed mechanism being coupled with said worktable and being displaceable with respect to the location of said workpiece, for controllably supplying a plurality of said components to be seized by said end effector and placed on said workpiece by said robotic manipulator wherein said component feed mechanism includes a plurality of component feeder transport devices, each component feeder transport device supplying a plurality of components for placement by said robotic manipulator on said workpiece and being positioned adjacent to that location on said worktable whereat said workpiece is supported; and
   control means, coupled with said robotic manipulator and said component feed mechanism, for controlling the operation of said robotic manipulator and said component feed mechanism such that, for each cycle of travel to seize a component and place a seized component on said workpiece by said robotic manipulator, said component feed mechanism is positioned at a location which effectively minimizes travel distance between successive component mounting locations on said workpiece, and including means for controlling the operation of said robotic manipulator translational movement of said end effector and said component feed mechanism to a location whereat a component supplied by said feed mechanism for placement on said workpiece is seized by said end effector and transported thereby to be placed on a prescribed component mounting location on said workpiece.

21. A system according to claim 20, wherein said end effector includes a mechanism for positioning a component seized thereby in a prescribed orientation.

22. A system according to claim 21, wherein said workpiece comprises a printed circuit board and said components include electronic circuit components to be mounted on and interconnected with one another by way of said printed circuit board.

23. A system according to claim 20, wherein said worktable is configured to accommodate differently sized workpieces.

24. A system according to claim 20, wherein said component feed mechanism comprises means for storing a plurality of said components and controllably feeding individual ones of said plurality of components to a position to be seized by said end effector and placed thereby on said workpiece.

25. A system according to claim 24, wherein said component feed mechanism further includes transport means, coupled with said worktable and said storing and controllably feeding means, for controllably transporting said storing and controllably feeding means over the surface of said worktable.

26. A system according to claim 20, further including workpiece conveyor means, coupled with said worktable, for controllably conveying said workpiece with respect to a location on said worktable whereat said robotic manipulator places components that have been seized from said component feed mechanism.

27. A system according to claim 20, further including a camera device, optically coupled with said workpiece, for enabling visual inspection of the component placement operation carried out by said end effector.

28. A system according to claim 26, wherein said end effector includes a mechanism for positioning a component seized thereby in a prescribed orientation.

29. A system according to claim 28, wherein said worktable is configured to accommodate differently sized workpieces.

30. A system according to claim 29, wherein said component feed mechanism comprises means for storing a plurality of said components and controllably feeding individual ones of said plurality of components to a position to be seized by said end effector and placed thereby on said workpiece.

31. A system according to claim 30, wherein said component feed mechanism further includes transport means, coupled with said worktable and said storing and controllably feeding means, for controllably transporting said storing and controllably feeding means over the surface of said worktable.

32. A system according to claim 31, wherein said workpiece comprises a printed circuit board and said components include electronic circuit components to be mounted on and interconnected with one another by way of said printed circuit board.

33. A system for transporting and assembling a plurality of electrical circuit components for surface mounting on a printed circuit board comprising:
   a worktable upon which said printed circuit board is supported;
   a robotic manipulator, coupled with said worktable and having a multi-axis end effector, for controllably seizing an electrical component from a component feed mechanism and placing said seized component on said printed circuit board;
   wherein said component feed mechanism, coupled with said worktable and being displaceable with respect to the location of said printed circuit board, controllably supplies a plurality of said components to be seized by said end effector and placed on said printed circuit board by said robotic manipulator, said component feed mechanism including a plurality of component feeder transport devices, each component feeder transport device supplying a plurality of components for placement by said robotic manipulator on said workpiece and being positioned adjacent to that location on said worktable whereat said workpiece is supported and control means, coupled with said robotic manipulator and said component feed mechanism, for controlling the operation of said robotic manipulator and said component feed mechanism such that, for each cycle of travel to seize a component and place a seized component on said printed circuit board by said robotic manipulator, said component feed mechanism is positioned at a location which effectively minimizes travel distance between successive component mounting locations on said printed circuit board and including means for controlling the operation of said robotic manipulator and said component feed mechanism such that there is simultaneous translational movement of said end effector and said component feed mechanism to a location whereat a component supplied by said feed mechanism for placement on said printed circuit board is seized by said end effector and transported thereby to be placed on a prescribed component mounting location on said printed circuit board.

* * * * *